(12) United States Patent
Uetake et al.

(10) Patent No.: US 9,819,153 B2
(45) Date of Patent: Nov. 14, 2017

(54) OPTICAL SEMICONDUCTOR DEVICE AND MANUFACTURING METHOD THEREOF

(71) Applicant: FUJITSU LIMITED, Kawasaki-shi, Kanagawa (JP)

(72) Inventors: Ayahito Uetake, Atsugi (JP); Manabu Matsuda, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/010,820

(22) Filed: Jan. 29, 2016

(65) Prior Publication Data

US 2016/0164259 A1    Jun. 9, 2016

Related U.S. Application Data

(63) Continuation of application No. PCT/JP2013/070981, filed on Aug. 2, 2013.

(51) Int. Cl.
*H01S 5/22* (2006.01)
*H01S 5/30* (2006.01)
(Continued)

(52) U.S. Cl.
CPC ............ *H01S 5/2205* (2013.01); *H01S 5/227* (2013.01); *H01S 5/3013* (2013.01); *H01S 5/222* (2013.01); *H01S 5/4031* (2013.01)

(58) Field of Classification Search
CPC .......... H01S 5/222; H01S 5/223; H01S 5/227; H01S 5/4031
See application file for complete search history.

(56) References Cited

U.S. PATENT DOCUMENTS 5,901,265 A * 5/1999 Tohyama ........... G02B 6/12004
                                                        385/131
6,358,316 B1    3/2002 Kizuki et al.
(Continued)

FOREIGN PATENT DOCUMENTS

JP    58-073176    5/1983
JP    59-200484    11/1984
(Continued)

OTHER PUBLICATIONS

R. J. Nelson, et al., "High-output power InGaAsP ($\lambda$=1.3 μm) strip-buried heterostructure lasers", Applied Physics Letters, vol. 36, No. 5, 1980, pp. 358-360 (3 pages). Cited in ISR for PCT/JP2013/070981.

(Continued)

*Primary Examiner* — Michael Carter
(74) *Attorney, Agent, or Firm* — Fujitsu Patent Center

(57) ABSTRACT

A semiconductor laser in a ridge waveguide structure includes: a semiconductor substrate; a lower cladding layer which is formed on the semiconductor substrate; an active layer and a semiconductor layer which are in parallel on the lower cladding layer and are connected with each other; a first upper cladding layer locally aligned above the active layer; a second upper cladding layer locally aligned above the semiconductor layer; and a third upper cladding layer locally aligned above the active layer to confine light which is guided in the active layer, wherein the semiconductor layer has a band gap which is larger than that of the active layer. According to this constitution, an optical semiconductor device with high reliability in which the ridge waveguide structure whose manufacturing is relatively easy is applied, and current diffusion and electrical crosstalk between lasers in the ridge waveguide structure are suppressed is enabled.

8 Claims, 19 Drawing Sheets

(51) Int. Cl.
*H01S 5/227* (2006.01)
*H01S 5/40* (2006.01)

(56) References Cited

U.S. PATENT DOCUMENTS

| | | | |
|---|---|---|---|
| 7,133,430 | B2 | 11/2006 | Sato |
| 7,736,922 | B2 | 6/2010 | Sato |
| 7,787,509 | B2 * | 8/2010 | Ukai .................... B82Y 20/00 372/45.011 |
| 7,874,908 | B2 | 1/2011 | Walker et al. |
| 2004/0086015 | A1 * | 5/2004 | Kawahara ............. H01S 5/0265 372/45.01 |
| 2006/0252519 | A1 | 11/2006 | Walker et al. |
| 2007/0091956 | A1 | 4/2007 | Sato |
| 2009/0201961 | A1 | 8/2009 | Sato |
| 2013/0177037 | A1 | 7/2013 | Yagi |

FOREIGN PATENT DOCUMENTS

| | | |
|---|---|---|
| JP | 02-007591 | 1/1990 |
| JP | 03-030487 | 2/1991 |
| JP | 06-232099 | 8/1994 |
| JP | 8-8483 | 1/1996 |
| JP | 2000-312051 | 11/2000 |
| JP | 2004-158562 | 6/2004 |
| JP | 2004-228340 | 8/2004 |
| JP | 2011-233829 | 11/2011 |
| JP | 2012-209489 | 10/2012 |
| JP | 2013-143393 | 7/2013 |

OTHER PUBLICATIONS

Jan P. Van Der Ziel, et al., "InGaAsP ($\lambda$=1.3 µm) Strip Buried Heterostructure Lasers Grown by MOCVD", IEEE Journal of Quantum Electronics, vol. 27, No. 11, 1991, pp. 2378-2385 (8 pages). Cited in ISR for PCT/JP2013/070981.

International Search Report and Written Opinion of the International Searching Authority (Form PCT/ISA/210, Form PCT/ISA/237), mailed in connection with PCT/JP2013/070981 and dated Nov. 12, 2013 (6 pages). Partial translation of the WO/ISA.

JPOA—Office Action of Japanese Patent Application No. 2015-529302 dated Feb. 7, 2017, with full machine translation. Remaining references cited in the JPOA were previously submitted in the IDS filed on Jan. 4, 2017.

JPOA—Office Action of Japanese Patent Application No. 2015-529302 dated Oct. 11, 2016, with partial English translation of relevant part.

* cited by examiner

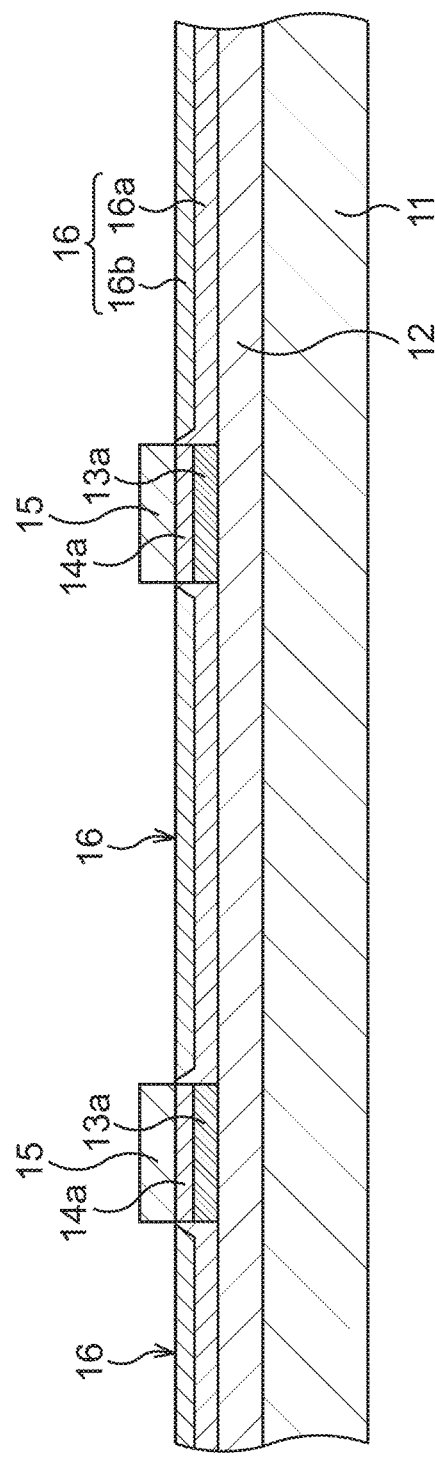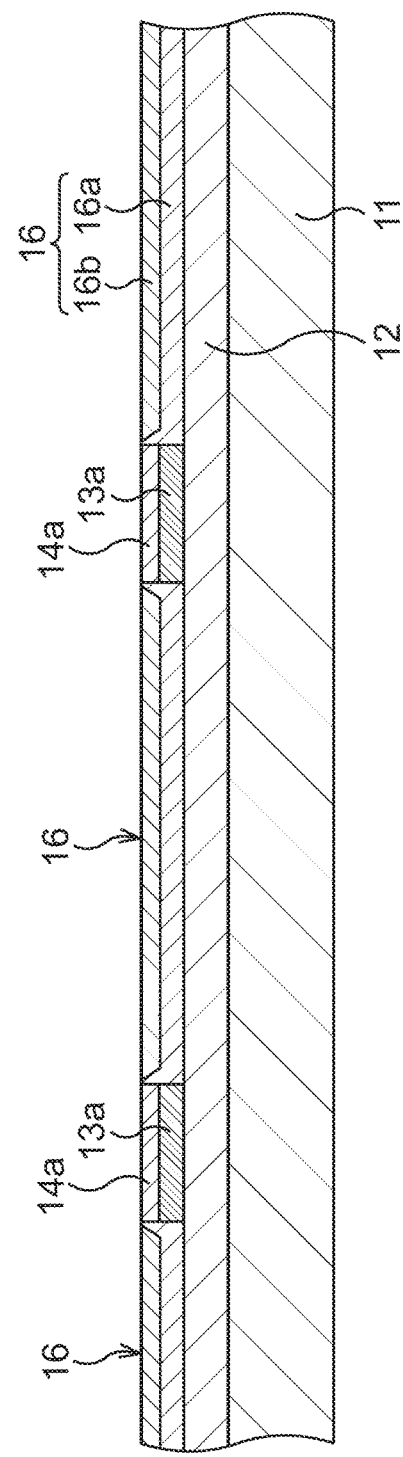
FIG. 3A
FIG. 3B

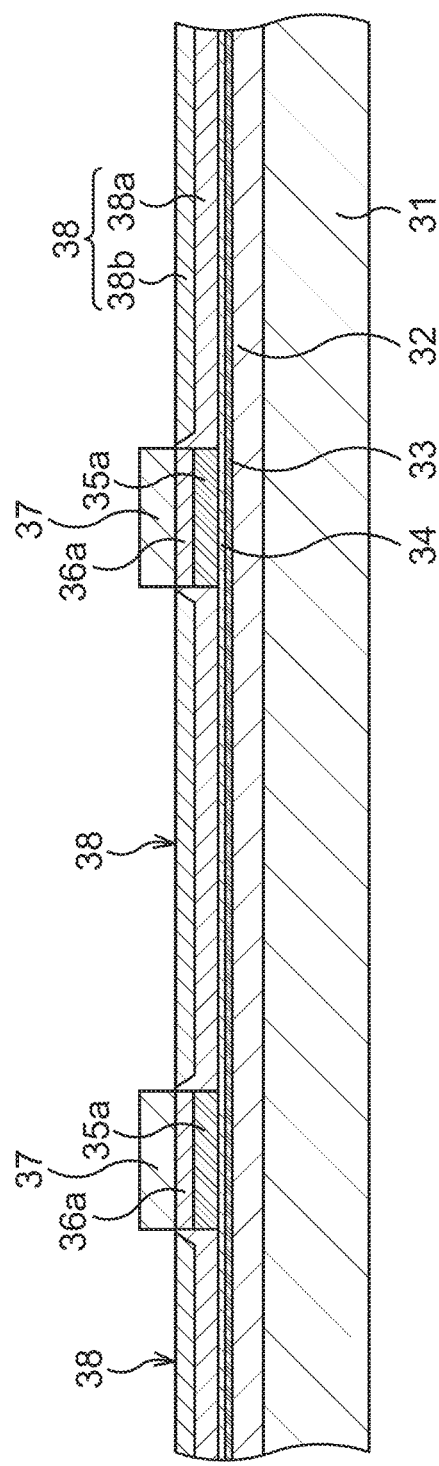
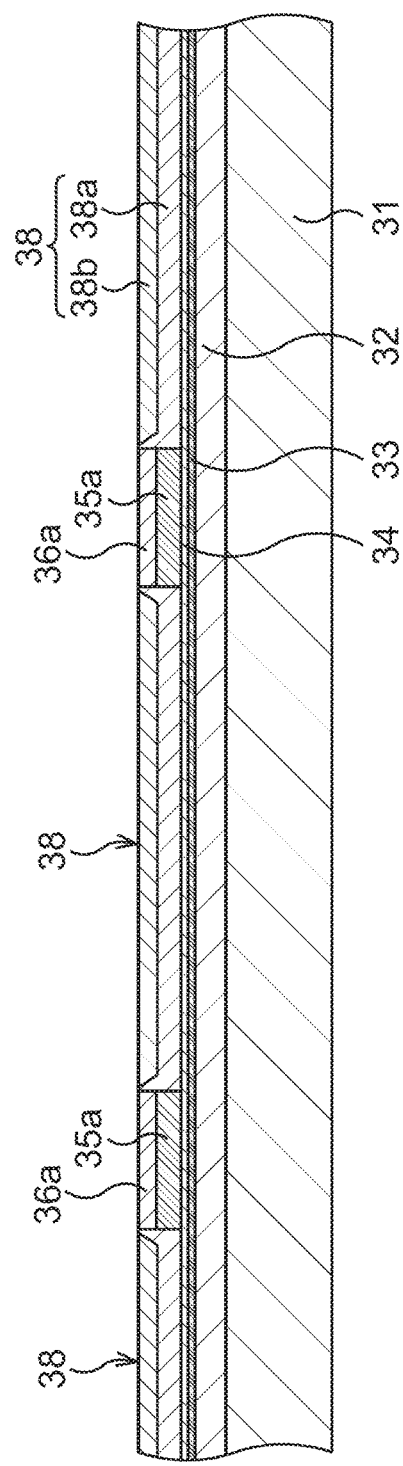
FIG. 12A
FIG. 12B

OPTICAL SEMICONDUCTOR DEVICE AND MANUFACTURING METHOD THEREOF

CROSS-REFERENCE TO RELATED APPLICATION

This application is a continuation application of International Application PCT/JP2013/070981 filed on Aug. 2, 2013 and designated the U.S., the entire contents of which are incorporated herein by reference.

FIELD

The present invention relates to an optical semiconductor device, and a manufacturing method thereof.

BACKGROUND

In recent years, data traffic amount of internet goes on increasing due to popularization of video distribution, spread of usage of data center, and so on, and capacity of a photonic network which enables the above has been increased. In local area network (LAN), standardization of 100 Gbps Eathernet (registered trademark) (GbE) which enables speeding up from 10 giga bit/s (Gbps) was completed in June 2010. In 100 GbE, four optical signals of 25.8 Gbps whose wavelengths are different are used while being wavelength division multiplexing. However, there are problems in a currently used 100 GbE optical module such that a size and a power consumption are large, and an optical module which is small in size and low in power consumption has been argued as an approach for further popularization.

In optical communication, an optical signal is generated by using a semiconductor laser, and this optical signal is transmitted by an optical fiber. A method to generate the optical signal is as follows:
- A method modulating non-modulated light which is generated at a semiconductor laser by an external modulator.
- A method modulating non-modulated light which is generated at a semiconductor laser by an optical modulator, using a modulator-integrated semiconductor laser where the semiconductor laser and the optical modulator are monolithic integrated.
- A method directly modulating a current being applied to the semiconductor laser, namely a direct modulation method.
- Among them, the direct modulation method is one in which a structure of an optical signal generation device (transmission device) is simple and a drive circuit of the optical signal generation device is also simple because the optical modulator is not necessary for the generation of the optical signal. Therefore, the direct modulation method is superior in a point of small-sizing of the optical module compared to other methods each requiring the optical modulator. In addition, further small-sizing can be expected by replacing the direct modulation laser which oscillates at different four wavelengths into a monolithic integrated array laser.

Structures of the semiconductor laser are roughly divided into two types of a buried hetero (BH) structure and a ridge waveguide structure. The BH structure is illustrated in FIG. 1A, and the ridge waveguide structure is illustrated in FIG. 1B.

In the BH structure as illustrated in FIG. 1A, a mesa structure is formed on an n-InP substrate 101. N-InP, an active layer material, p-InP, a contact layer material are grown on the n-InP substrate 101, and they are etched to a middle of n-InP, to thereby form a groove 102. The mesa structure having an active layer 104, an upper cladding layer 105, and a contact layer 106 is formed on a lower cladding layer 103 by the formation of the groove 102. For example, InP being a semi-insulating semiconductor where Fe is doped is buried in the groove 102 by regrowth, and a high-resistance buried layer 107 is formed. A p-type electrode 108 is formed on the contact layer 106, and an n-type electrode 109 is formed at a rear surface of the n-InP substrate 111, respectively.

As illustrated in FIG. 1B, the ridge waveguide structure is one in which a lower cladding layer 112 and an active layer 113 are sequentially formed at a whole surface on an n-InP substrate 111, and a ridge part is formed on the active layer 113. P-InP and a contact layer material are grown on the active layer 113, and they are etched to a middle of the p-InP to thereby form grooves 114. The ridge part having an upper cladding layer 115 and a contact layer 116 is formed on the active layer 113 by the formation of the grooves 114. A p-type electrode 117 is formed on the contact layer 116, and an n-type electrode 118 is formed on a rear surface of the n-InP substrate 101, respectively.

[Patent Document 1] Japanese Laid-open Patent Publication No. 2000-312051
[Patent Document 2] Japanese Laid-open Patent Publication No. 2011-233829
[Patent Document 3] Japanese Laid-open Patent Publication No. H6-232099

In the BH structure, the active layer 104 is completely buried in the high-resistance buried layer 107 being a semiconductor in a hetero structure, and therefore, it is possible to simultaneously perform confinement of light and carrier. In the BH structure, the carrier is effectively injected into the active layer 104, and therefore, it is an effective structure to reduce a volume of an active layer of a semiconductor laser. However, it is necessary to evenly bury the mesa structure whose hight exceeds 3 μm into the high-resistance buried layer 107, and therefore, manufacturing thereof is not easy, and various technologies are required.

On the other hand, the ridge waveguide structure is a structure in which a protruding-state ridge part is formed at an upper part of the active layer 113, and thereby, an equivalent refractive index at the upper part becomes large compared to a periphery of the upper part to thereby waveguide the light. In this structure, it is not necessary to perform the regrowth after the formation of the ridge part, and manufacturing thereof is easier compared to the BH structure. In the ridge waveguide structure, the active layer 113 exists at the whole surface, an active layer region which contributes to a laser oscillation is limited by a current injection region which is limited by the ridge part. However, actually, the injected carrier spreads at the upper cladding layer 115 on the active layer 113, and therefore, there is a defect in which an effective width of active layer becomes wide than a width of the ridge part. Besides, the active layer 113 exists continuously in a plane, and therefore, the injected carrier spreads in a horizontal direction, and there also is a defect in which a reactive current which does not contribute to the laser oscillation increases. Further, when an array laser is manufactured in the ridge waveguide structure by way of trial, the upper cladding layer 115 exists at the whole surface on the active layer 113, and the upper cladding layers 115 of respective semiconductor lasers are connected. Accordingly, there is a defect in which an electrical resistance between the semiconductor lasers becomes small, and signal deterioration due to an electrical crosstalk occurs.

As a structure to limit the current injection region by surrounding the active layer region existing directly under the ridge part with a semi-insulating layer, it is proposed to perform a process enabling high-resistance by means of impurity diffusion up to the active layer (refer to Patent Literature 1). However, by the impurity diffusion, an impurity concentration becomes maximum in a vicinity of a surface, and the impurity concentration decreases in a depth direction, and therefore, it is impossible to freely set the concentration and a diffusion length. Besides, as for InP, it is possible to change n-type InP into p-type InP or semi-insulation InP, but it is difficult to change p-type InP into n-type InP or high-resistance InP by ion-implantation or the impurity diffusion, and therefore, there is a problem in which an art of Patent Literature 1 is not applicable for a widely used structure on the n-type InP substrate where an upper part of the active layer becomes a p-type cladding.

SUMMARY

An aspect of an optical semiconductor device includes: a semiconductor substrate; a lower cladding layer which is formed on the semiconductor substrate; an active layer and a semiconductor layer which are in parallel on the lower cladding layer and are connected with each other; a first upper cladding layer locally aligned above the active layer; a second upper cladding layer locally aligned above the semiconductor layer; and a third upper cladding layer formed above the active layer to confine light which is guided in the active layer, wherein the semiconductor layer has a band gap which is larger than that of the active layer.

An aspect of a manufacturing method of an optical semiconductor device includes: forming a lower cladding layer on a semiconductor substrate; forming an active layer and a semiconductor layer which are in parallel on the lower cladding layer and are connected with each other; and forming an upper cladding layer which is aligned above the active layer and confines light which is guided in the active layer, wherein the semiconductor layer has a band gap which is larger than that of the active layer.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 3A is a schematic sectional view illustrating the manufacturing method of the semiconductor laser in the ridge waveguide structure according to the first embodiment subsequent to FIG. 2C;

FIG. 3B is a schematic sectional view illustrating the manufacturing method of the semiconductor laser in the ridge waveguide structure according to the first embodiment subsequent to FIG. 3A;

FIG. 12A is a schematic sectional view illustrating the manufacturing method of the distributed reflector laser in the ridge waveguide structure according to the second embodiment subsequent to FIG. 11C;

FIG. 12B is a schematic sectional view illustrating the manufacturing method of the distributed reflector laser in the ridge waveguide structure according to the second embodiment subsequent to FIG. 12A;

DESCRIPTION OF EMBODIMENTS

Hereinafter, preferred embodiments of an optical semiconductor device are described in detail with reference to the drawings.

<First Embodiment>

In a first embodiment, a wavelength of 1.3 μm band semiconductor laser in a ridge waveguide structure which is used as a communication light source is exemplified, and a constitution is described together with a manufacturing method thereof.

FIG. 2A to FIG. 9 are schematic sectional views each illustrating the manufacturing method of the semiconductor laser in the ridge waveguide structure according to the first embodiment in process sequence.

Figure 2A:
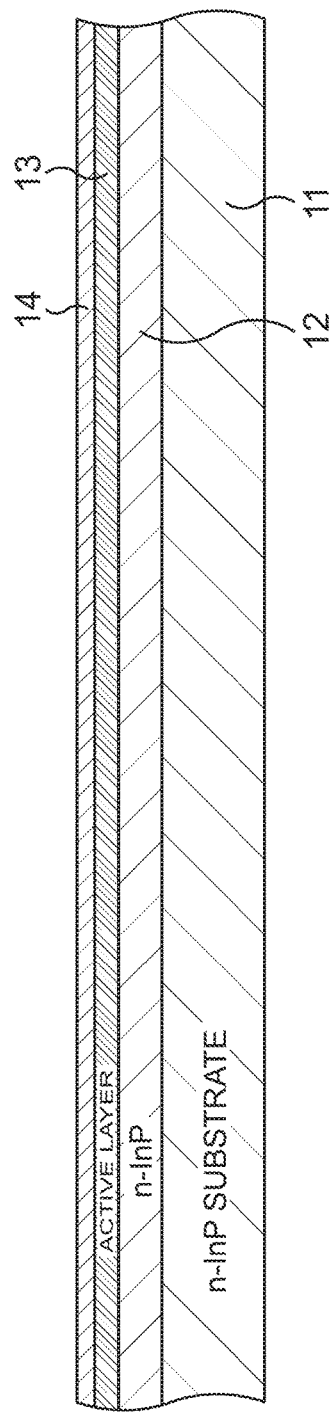
FIG. 2A is a schematic sectional view illustrating a manufacturing method of a semiconductor laser in the ridge waveguide structure according to a first embodiment.

At first, as illustrated in FIG. 2A, a lower cladding layer 12, a multiple quantum well (MQW) layer 13, and a p-InP layer 14 are sequentially formed on an n-InP substrate 11.

In detail, n-InP is grown for a thickness of approximately 0.3 μm, an MQW active layer where a well layer containing AlGaInAs and a barrier layer containing AlGaInAs are multiply stacked is grown for a thickness of approximately 0.2 μm, and p-InP is grown for a thickness of approximately 0.15 μm sequentially on a (100) plane of the n-InP substrate 11 by, for example, the metal organic vapor phase epitaxy (MOVPE) method. The lower cladding layer 12, the MQW layer 13, and the p-InP layer 14 are thereby stacked to be formed on the n-InP substrate 11. For example, the molecular beam epitaxy (MBE) method or the like may be used instead of the MOVPE method.

Figure 2B:
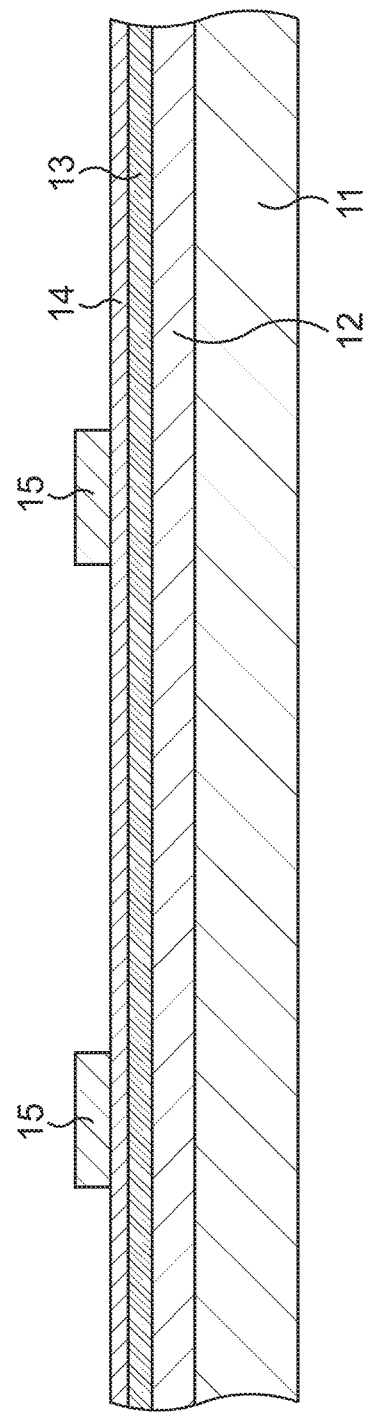
FIG. 2B is a schematic sectional view illustrating the manufacturing method of the semiconductor laser in the ridge waveguide structure according to the first embodiment subsequent to FIG. 2A.

Subsequently, as illustrated in FIG. 2B, etching masks 15 are formed.

In detail, an insulating material, for example, $SiO_2$ is deposited by the CVD method or the like at a whole surface of the p-InP layer 14. This $SiO_2$ is processed by the lithography, and $SiO_2$ is remained only at portions where ridge parts are to be formed. The etching masks 15 are thereby formed on the p-InP layer 14.

Figure 2C:
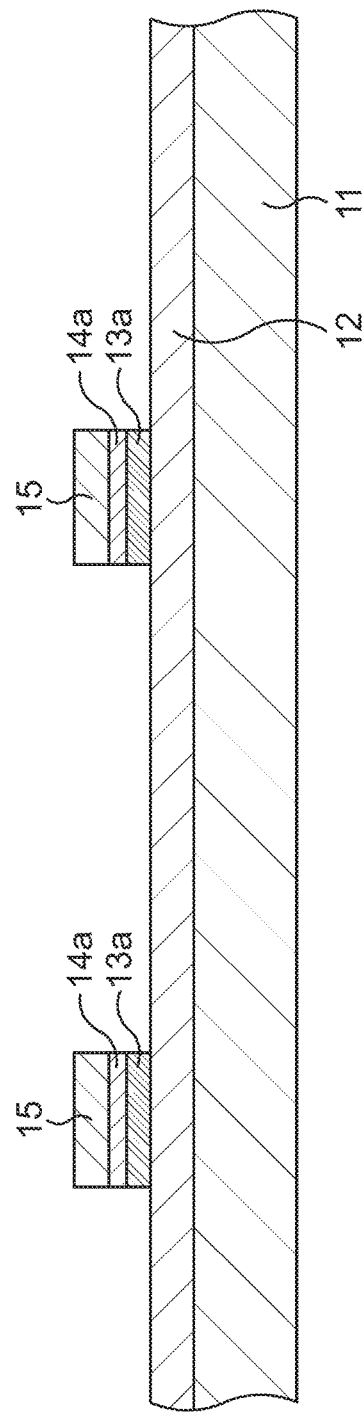
FIG. 2C is a schematic sectional view illustrating the manufacturing method of the semiconductor laser in the ridge waveguide structure according to the first embodiment subsequent to FIG. 2B.

Subsequently, as illustrated in FIG. 2C, active layers 13a and first upper cladding layers 14a are formed.

In detail, the p-InP layer 14 and the MQW layer 13 are etched by using the etching masks 15. The MQW layer 13 and the p-InP layer 14 are thereby removed while remaining only at the portions under the etching masks 15, and the active layers 13a and the first upper cladding layers 14a are formed on the lower cladding layer 12. A p-type impurity concentration of p-InP of the first upper cladding layer 14a is approximately $1 \times 10^{18}$ cm$^{-3}$.

Subsequently, as illustrated in FIG. 3A, semiconductor layers 16 are formed, which are connected to the active layers 13a and the first upper cladding layers 14a on the lower cladding layer 12.

In detail, for example, i-InGaAsP is regrown for a thickness of approximately 0.2 μm, and i-InP is regrown for a thickness of approximately 0.15 μm sequentially as an i (intrinsic)-type semiconductor by the MOVPE method or the like. The semiconductor layers 16 each made up by stacking an i-InGaAsP layer 16a and an i-InP layer 16b, and being butt-jointed to the active layer 13a and the first upper cladding layer 14a are thereby formed.

Subsequently, as illustrated in FIG. 3B, the etching masks 15 are removed.

In detail, the etching masks 15 are removed by the wet treatment using a predetermined chemical liquid, for example, buffered hydrofluoric acid.

Figure 4:
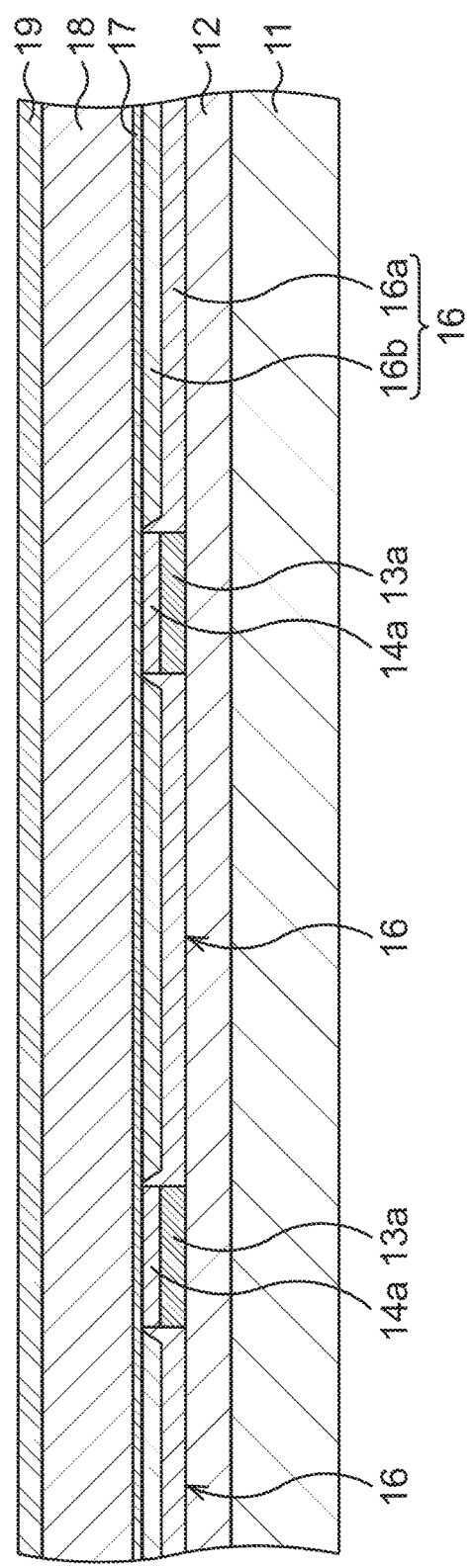
FIG. 4 is a schematic sectional view illustrating the manufacturing method of the semiconductor laser in the ridge waveguide structure according to the first embodiment subsequent to FIG. 3B.

Subsequently, as illustrated in FIG. 4, an etch stop layer 17, a p-InP layer 18, and an InGaAs layer 19 are sequentially formed.

In detail, p-InGaAsP is grown for a thickness of approximately 0.02 μm, p-InP is grown for a thickness of approximately 1.5 μm, and InGaAs is grown for a thickness of approximately 0.3 μm sequentially at a whole surface on the first upper cladding layers 14a and the semiconductor layers 16 by the MOVPE method or the like. The etch stop layer 17, the p-InP layer 18, and the InGaAs layer 19 are thereby stacked to be formed.

Figure 5:
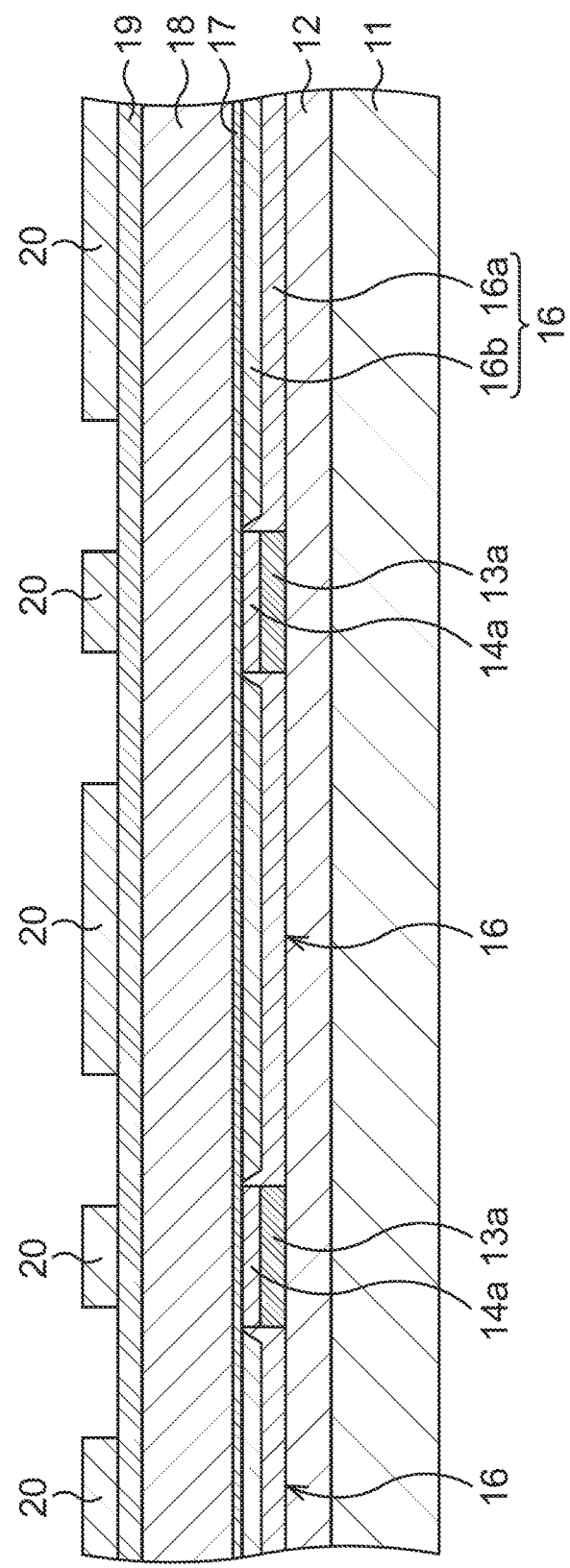
FIG. 5 is a schematic sectional view illustrating the manufacturing method of the semiconductor laser in the ridge waveguide structure according to the first embodiment subsequent to FIG. 4.

Subsequently, as illustrated in FIG. 5, etching masks 20 are formed.

In detail, the insulating material, for example, $SiO_2$ is deposited by the CVD method or the like at a whole surface of the InGaAs layer 19. This $SiO_2$ is processed by the lithography, and $SiO_2$ is remained so as to expose formation portions of grooves to isolate by each laser (by each ridge part). The etching masks 20 are thereby formed on the InGaAs layer 19.

Figure 6:
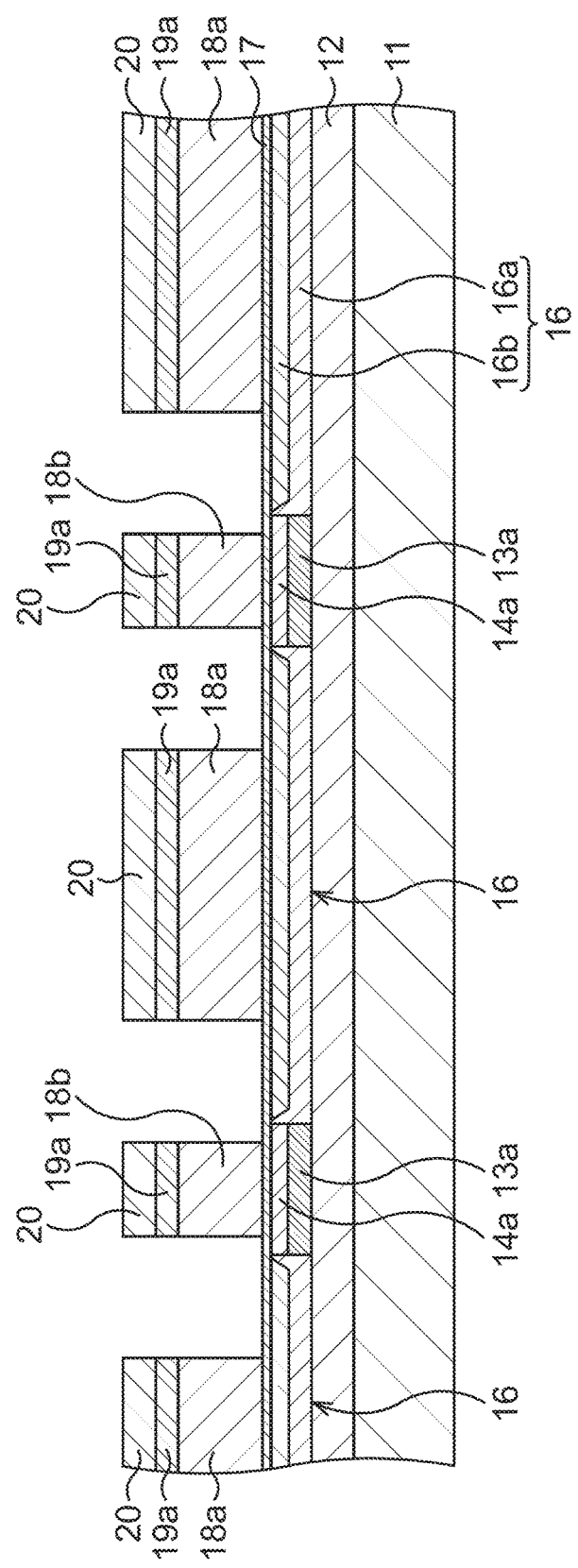
FIG. 6 is a schematic sectional view illustrating the manufacturing method of the semiconductor laser in the ridge waveguide structure according to the first embodiment subsequent to FIG. 5.

Subsequently, as illustrated in FIG. 6, second upper cladding layers 18a, third upper cladding layers 18b and contact layers 19a are formed.

In detail, at first, the InGaAs layer 19 is etched by using the etching masks 20. Subsequently, the p-InP layer 18 is wet-etched by using etchant which selectively etches only InP. At this time, the etch stop layer 17 exists, and thereby, only the p-InP layer 18 is surely etched without making the etchant penetrate into the semiconductor layers 16 and the first upper cladding layers 14a. The second upper cladding layers 18a and the contact layers 19a are thereby formed on the etch stop layer 17. The third upper cladding layers 18b and the contact layers 19a are thereby formed on the etch stop layer 17. The ridge parts are each formed of the third upper cladding layer 18b and the contact layer 19a. A ridge part width is, for example, approximately 2 μm. Here, the first upper cladding layers 14a are each locally aligned above the active layer 13a. The second upper cladding layers 18a are each locally aligned above the semiconductor layer 16. The third upper cladding layers 18b are each formed above the active layer 13a.

Figure 7:
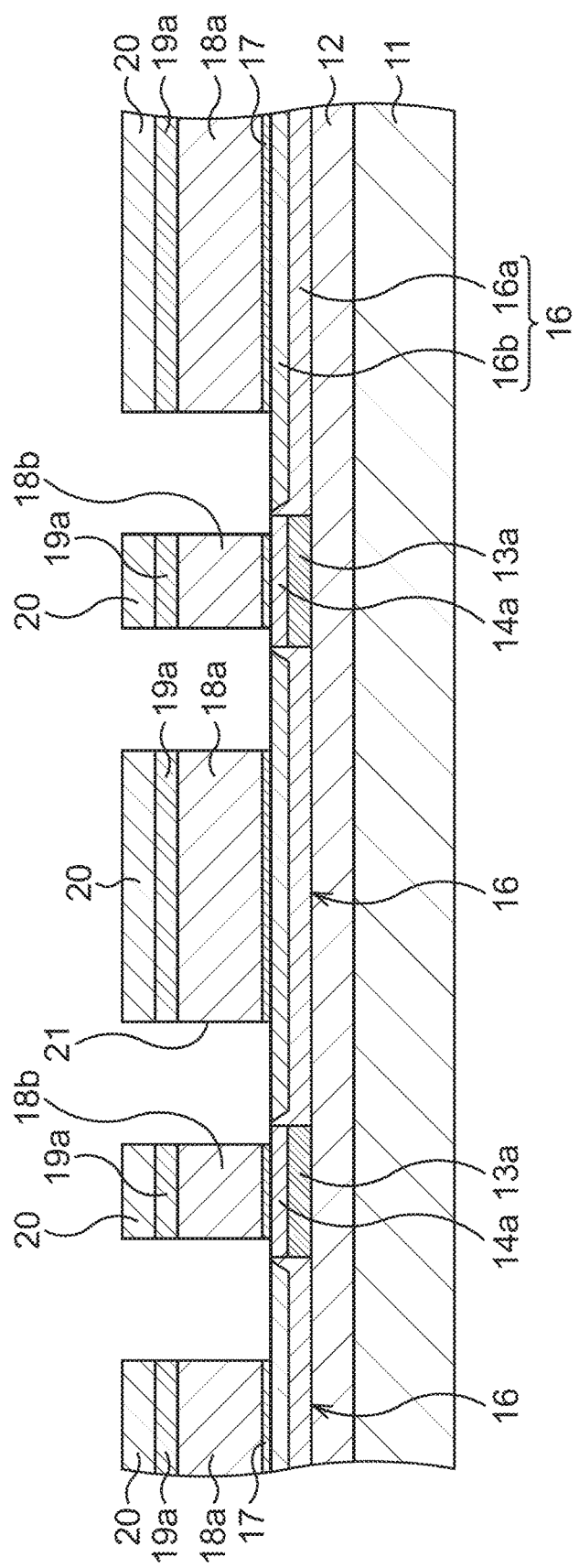
FIG. 7 is a schematic sectional view illustrating the manufacturing method of the semiconductor laser in the ridge waveguide structure according to the first embodiment subsequent to FIG. 6.

Subsequently, as illustrated in FIG. 7, the etch stop layer 17 is etched.

In detail, the etch stop layer 17 is wet-etched by using an etchant whose etching selectivity between InGaAsP and InP is large. At this time, in general, the etchant whose etching selectivity between InGaAsP and InP is large has a characteristic to etch InGaAs, and therefore, the contact layers 19a each made up of the InGaAs layer are etched for, for example, 0.05 µm. Grooves 21 are thereby formed, and each laser (each ridge part) is electrically isolated. An end part of a cross section which is perpendicular to an optical waveguide direction of each of the first upper cladding layers 14a positions below the groove 21 which defines the third upper cladding layer 18b.

Figure 8:
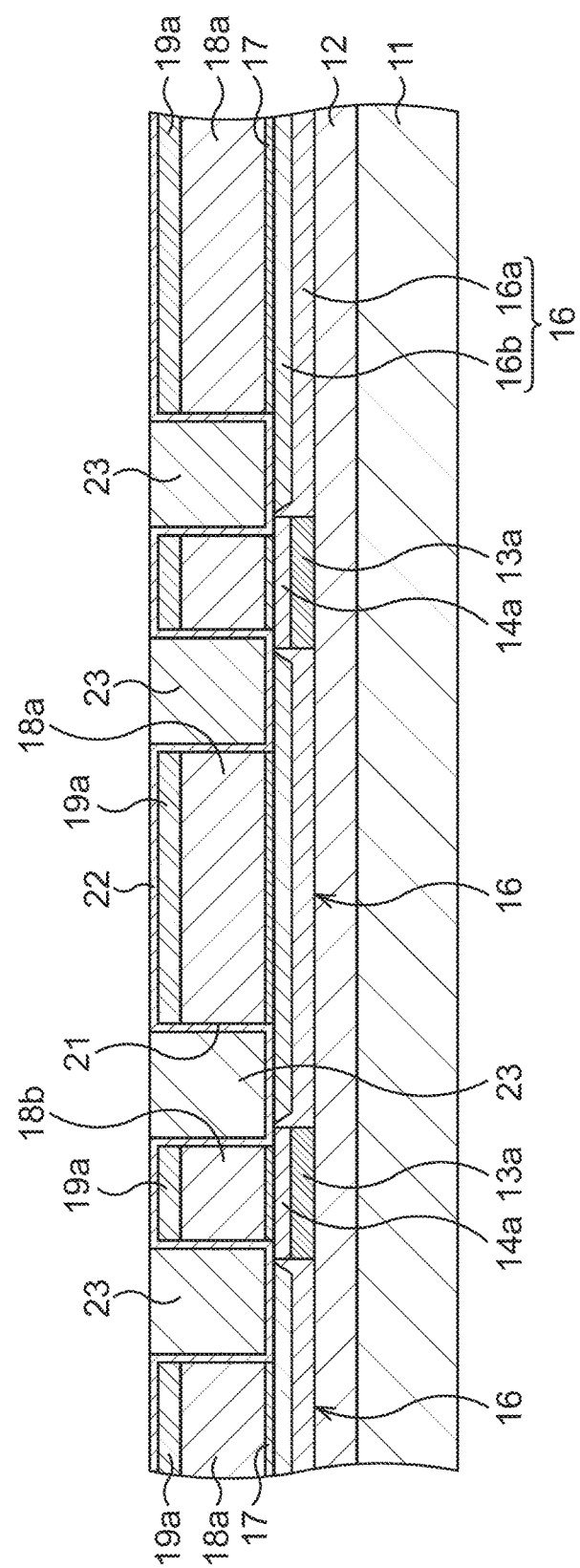
FIG. 8 is a schematic sectional view illustrating the manufacturing method of the semiconductor laser in the ridge waveguide structure according to the first embodiment subsequent to FIG. 7.

Subsequently, as illustrated in FIG. 8, a protective film 22 and BCBs 23 which bury the grooves 21 are formed.

In detail, at first, an insulating film, for example, SiO$_2$ is deposited at a whole surface so as to cover internal surfaces of the grooves 21 by the CVD method or the like. The protective film 22 is thereby formed.

Next, the BCBs (benzocyclobutene) 23 are formed so as to bury in the grooves 21 with the protective film 22 therebetween.

Figure 9:
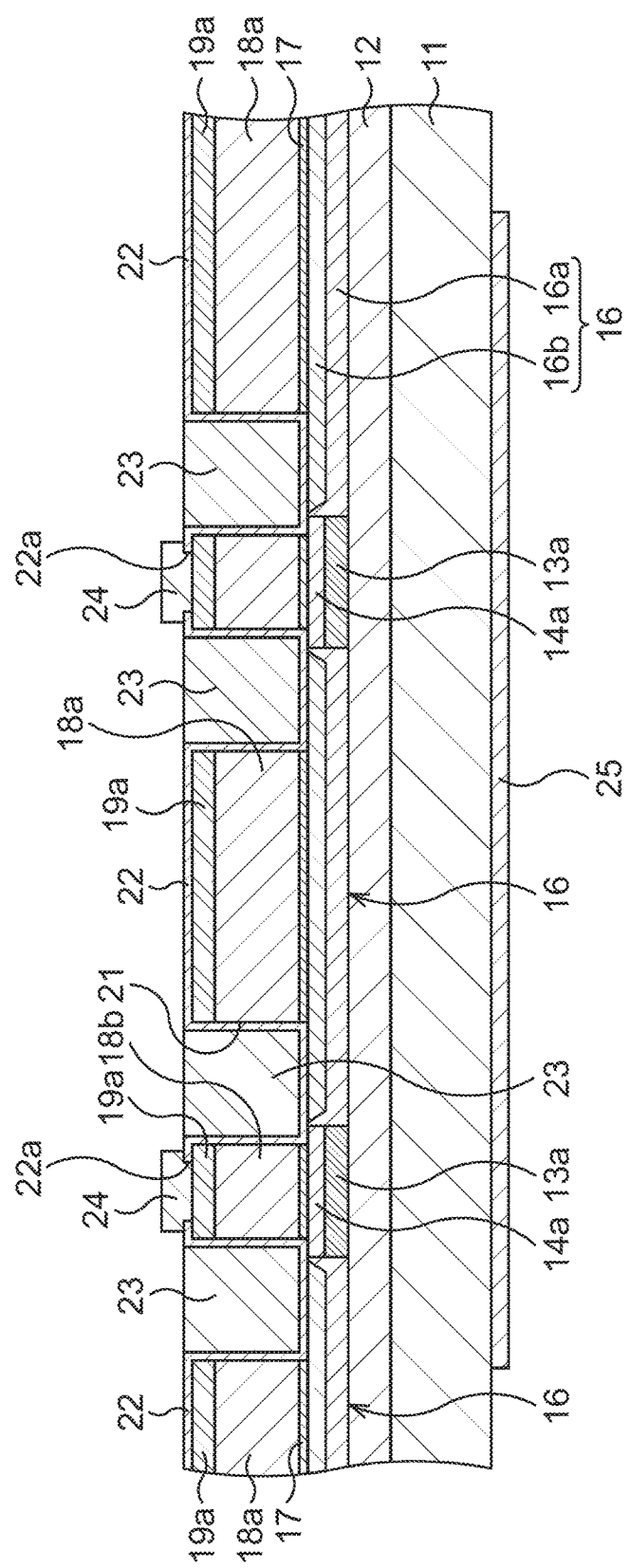
FIG. 9 is a schematic sectional view illustrating the manufacturing method of the semiconductor laser in the ridge waveguide structure according to the first embodiment subsequent to FIG. 8.

Subsequently, as illustrated in FIG. 9, p-electrodes 24 each bury an opening 22a and are electrically connected to the contact layer 19a are formed.

Next, a thickness is made thin to be, for example, approximately 150 µm by polishing a rear surface of the n-InP substrate 11. Then, an n-electrode 25 is formed on the rear surface of the n-InP substrate 11.

After that, the semiconductor laser in the ridge waveguide structure according to the embodiment is formed by going through various processes such as a predetermined arraying, coating for an end face film.

In the semiconductor laser in the ridge waveguide structure according to the embodiment, the upper cladding layers each made up of the first upper cladding layer 14a and the third upper cladding layer 18b are formed to be aligned above the active layer 13a. The lower cladding layer 12 under the active layers 13a is formed at the whole surface below the ridge parts each made up of the third upper cladding layer 18b and the contact layer 19a. Here, both sides of the active layer 13a are sandwiched by the i-InGaAsP layers 16a of the semiconductor layer 16. The first upper cladding layer 14a on the active layer 13a has a structure in which both sides thereof are sandwiched by the i-InP layers 16b of the semiconductor layers 16. Widths of the active layer 13a and the first upper cladding layer 14a are larger than the ridge part width, and the active layer 13a and the first upper cladding layer 14a exist up to directly under portions separated from both sides of a root part of the ridge part for approximately 2 µm in a lateral direction. The semiconductor layers 16 which are connected to the active layer 13a and the first upper cladding layer 14a are formed at outside the active layer 13a and the first upper cladding layer 14a.

The i-InGaAsP layer 16a of the semiconductor layer 16 is formed in a composition with an emission wavelength of 1.18 µm (band gap energy of 1.05 eV) which is lattice-matched with InP, and a band gap of the i-InGaAsP layer 16a is larger than that of the active layer 13a which is formed in a composition with the emission wavelength of 1.3 µm (band gap energy of 0.95 eV). The active layer 13a is sandwiched by the semiconductor layers 16 each having the large band gap, and therefore, diffusion of carrier injected into the active layer 13a in the lateral direction is suppressed, and it is possible to effectively inject the carrier into the active layer 13a.

The first upper cladding layer 14a at the upper part of the active layer 13a exists only at directly above the active layer 13a, and is connected to the i-InP layer 16b of the semiconductor layer 16 by the groove 21. The third upper cladding layer 18b in the same conductive type at each ridge part exists only up to a part of the groove 21, and therefore, the third upper cladding layer 18b of each ridge part is electrically insulated, and the crosstalk between lasers is suppressed. The both sides of the first upper cladding layer 14a are sandwiched by the i-InP layers 16b. Therefore, an effect suppressing current diffusion where a current limited by the ridge part spreads at directly above the active layer is obtained.

On the other hand, for example, according to an art of Patent Literature 2, p-InP upper cladding layers are not isolated between respective lasers, and therefore, it is obvious that it is different from a constitution of the embodiment.

A refractive index of the i-InGaAsP layer 16a is 3.39, and it is almost the same as an equivalent refractive index of 3.40 of the active layer 13a. On the other hand, in case of the BH structure, it has a constitution in which light is confined in a lateral direction by using, for example, InP with the refractive index of 3.20, but in the embodiment, it has not a constitution in which the light is confined in the lateral direction. The semiconductor laser according to the embodiment has a constitution in which the protruding-state ridge parts are formed above the active layers 13a, then the equivalent refractive index at that part becomes large compared to the periphery, and thereby, the light is guided. Therefore, it is different from the semiconductor laser in the BH structure.

Figure 10:
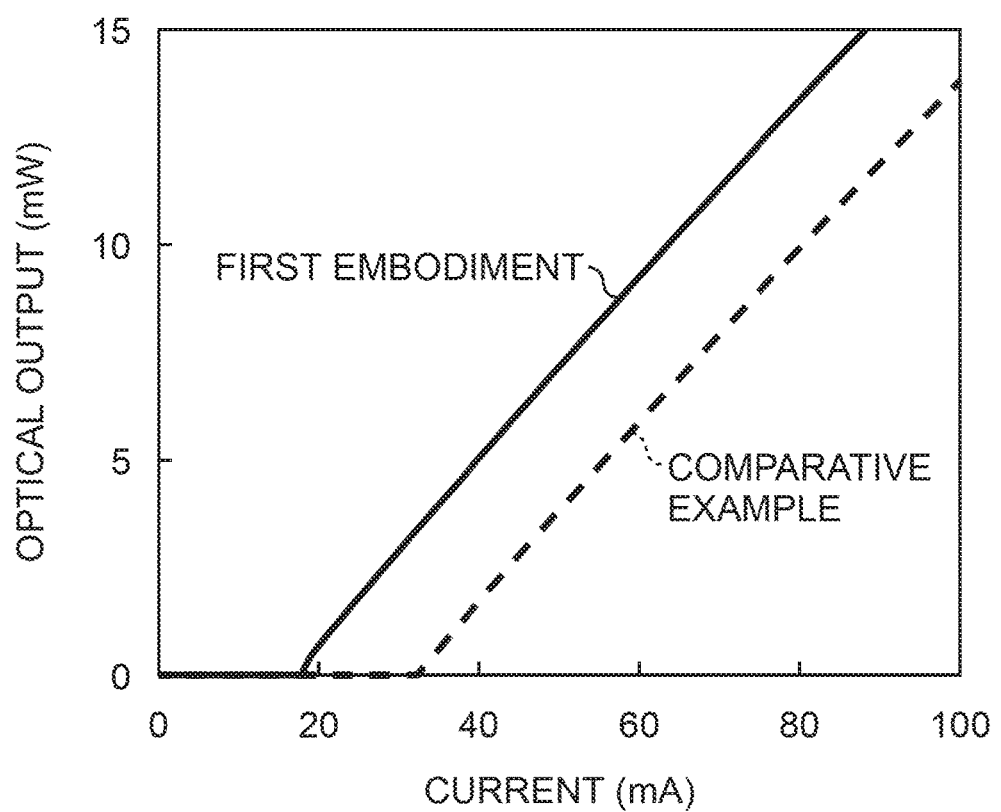
FIG. 10 is a characteristic chart illustrating a result of investigation by a simulation as for a current-optical output characteristics in the semiconductor laser according to the first embodiment based on a comparison with a comparative example.

FIG. 10 is a characteristic chart illustrating a result of investigation by a simulation as for a current-optical output characteristics in the semiconductor laser according to the embodiment based on a comparison with a comparative example.

Figure 1A:
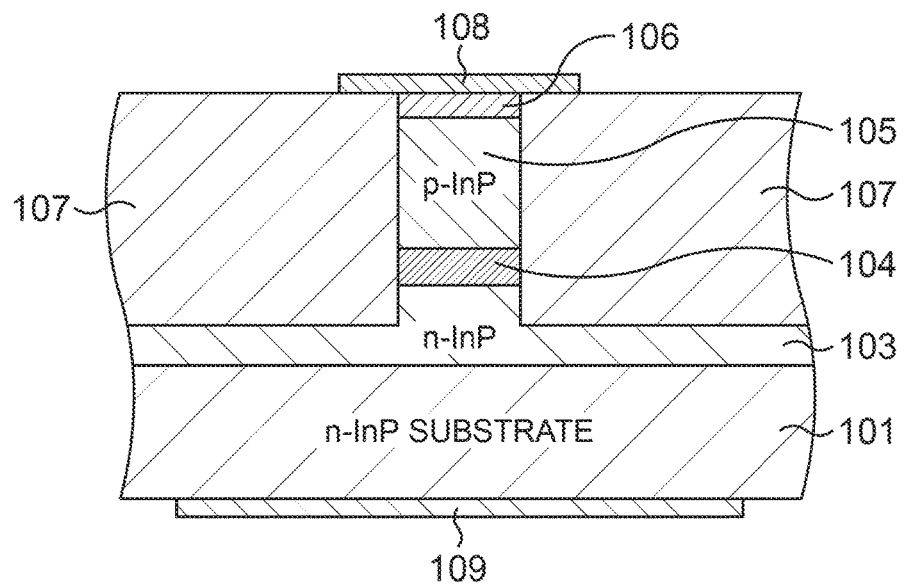
FIG. 1A is a schematic sectional view illustrating a BH structure being one of device structures of a semiconductor laser.
Figure 1B:
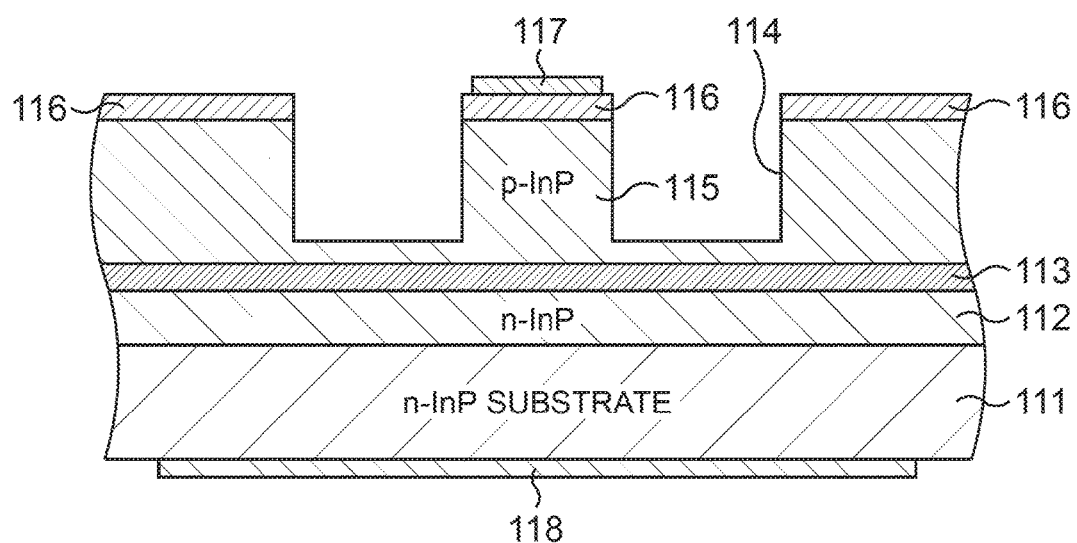
FIG. 1B is a schematic sectional view illustrating a ridge waveguide structure being one of the device structures of the semiconductor laser.

As the comparative example, the structure in which the active layer 113 is formed at the whole surface illustrated in FIG. 1B is applied. A value of a laser oscillation threshold current is 33 mA in the comparative example, but it is reduced to be 19 mA in the embodiment. It is thereby verified that the carrier is effectively injected into the active layer in the embodiment compared to the comparative example.

As described hereinabove, according to the embodiment, the semiconductor laser with high reliability in which the ridge waveguide structure whose manufacturing is relatively easy is applied, and the current diffusion and the electrical crosstalk between lasers in the ridge waveguide structure are suppressed is enabled.

<Second Embodiment>

In a second embodiment, a distributed Bragg reflector (DBR) laser in the ridge waveguide structure is exemplified, and a constitution thereof is described together with a manufacturing method thereof.

Figure 16:
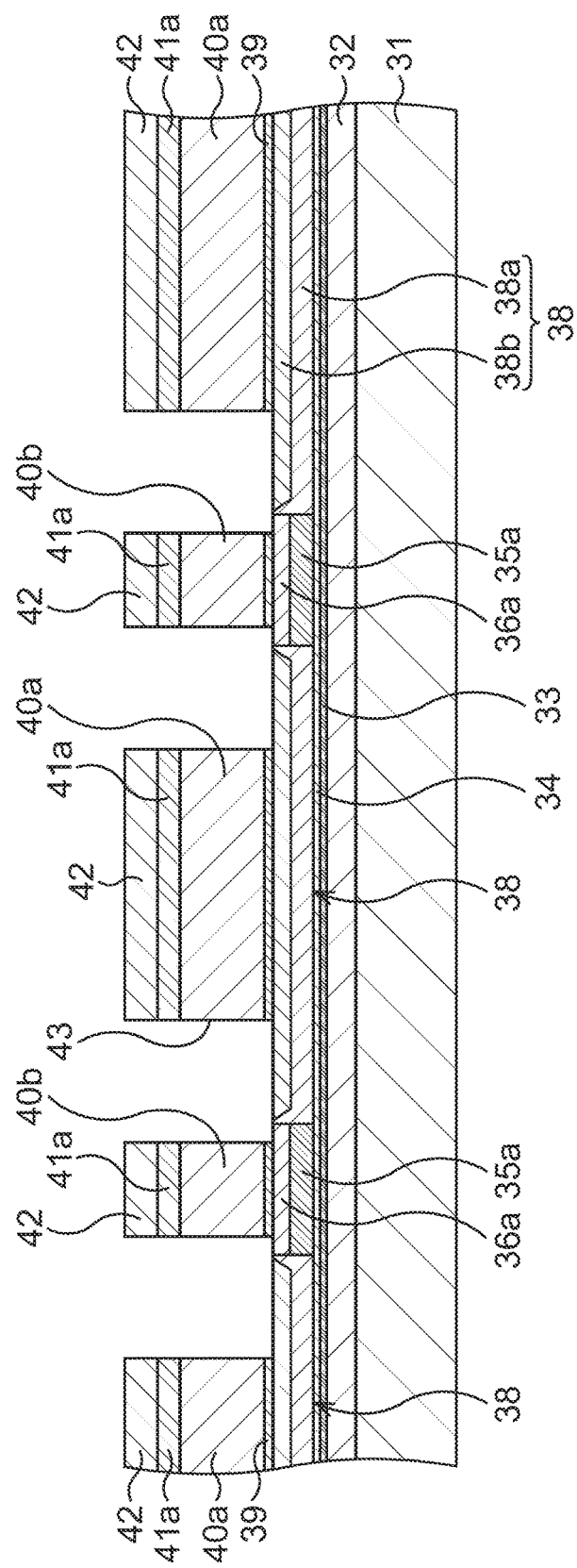
FIG. 16 is a schematic sectional view illustrating the manufacturing method of the distributed reflector laser in the ridge waveguide structure according to the second embodiment subsequent to FIG. 15.
Figure 17:
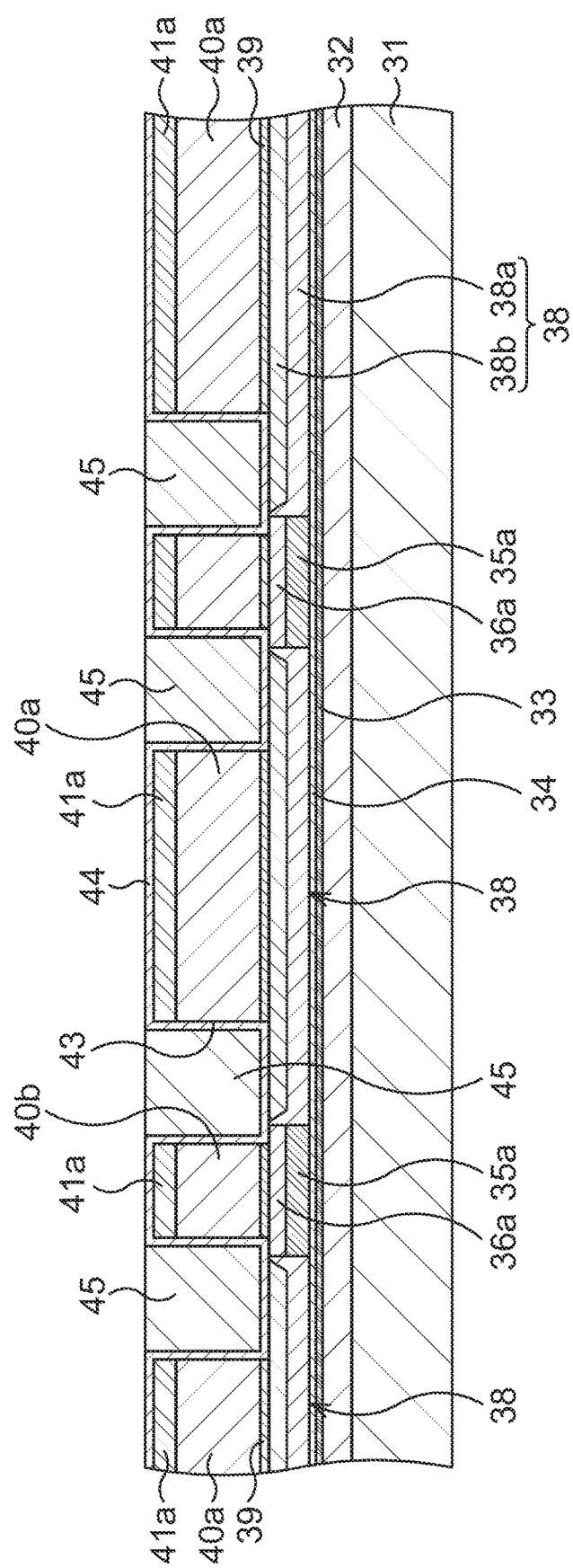
FIG. 17 is a schematic sectional view illustrating the manufacturing method of the distributed reflector laser in the ridge waveguide structure according to the second embodiment subsequent to FIG. 16.
Figure 18:
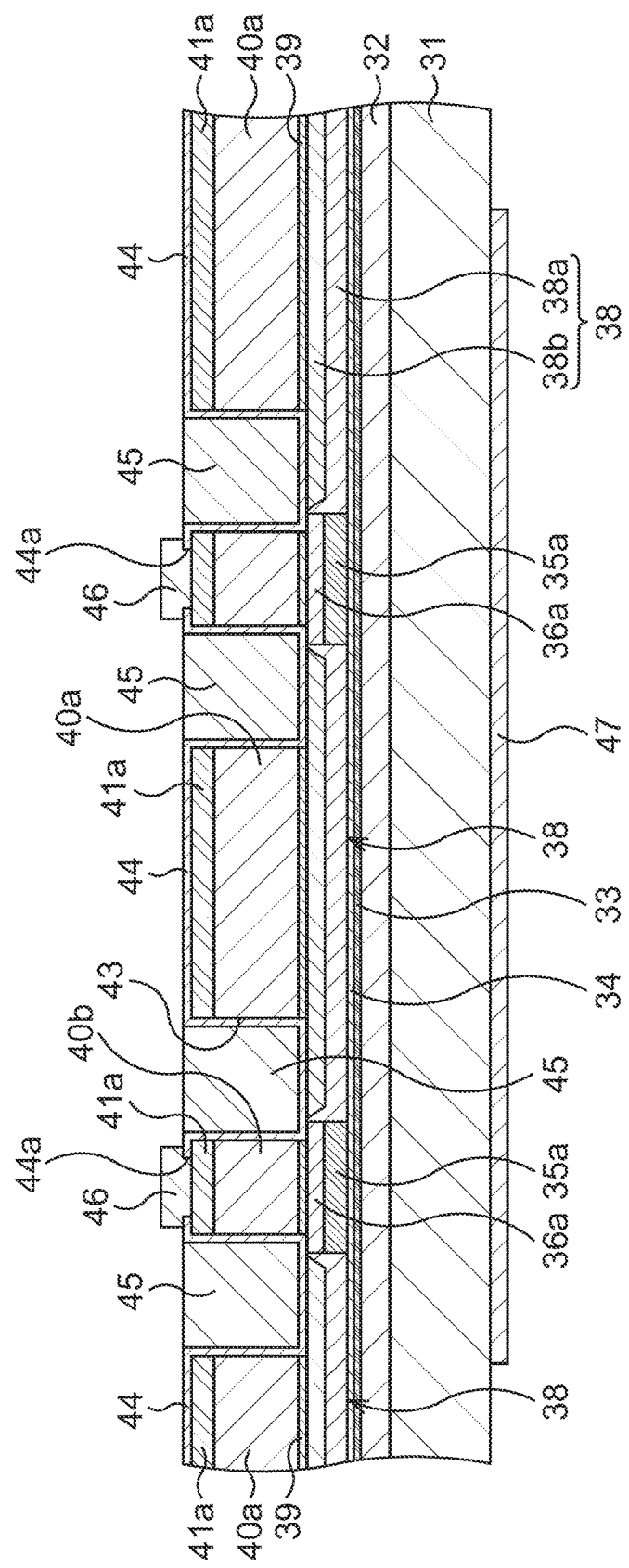
FIG. 18 is a schematic sectional view illustrating the manufacturing method of the distributed reflector laser in the ridge waveguide structure according to the second embodiment subsequent to FIG. 17.
Figure 19:
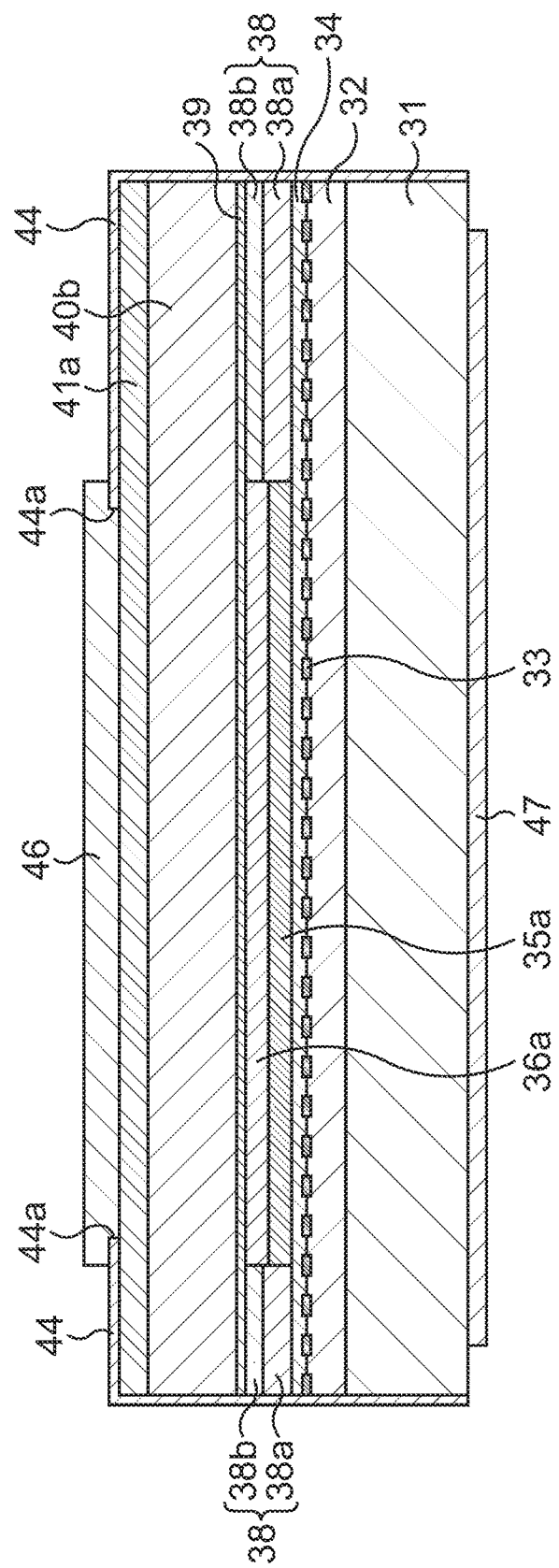
FIG. 19 is a schematic sectional view along a direction in parallel to an optical waveguide direction corresponding to FIG. 18.

FIG. 11A to FIG. 18 are schematical sectional views each along a direction perpendicular to an optical waveguide direction, illustrating the manufacturing method of the distributed reflector laser according to the second embodiment in process sequence, and FIG. 19 is a schematic sectional view along a direction in parallel to the optical waveguide direction corresponding to FIG. 18.

Figure 11A:
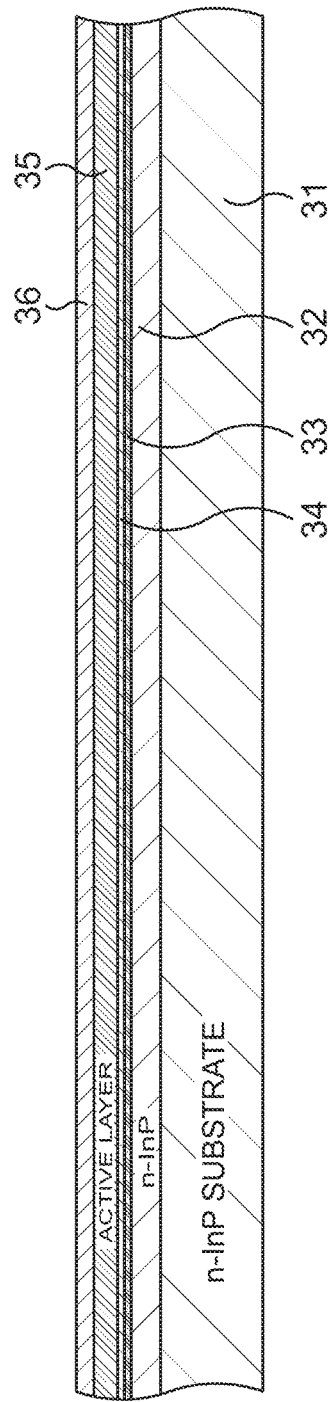
FIG. 11A is a schematic sectional view illustrating a manufacturing method of a distributed reflector laser in the ridge waveguide structure according to a second embodiment.

At first, as illustrated in FIG. 11A, a lower cladding layer 32, a diffractive grating layer 33, a spacer layer 34, a multiple quantum well (MQW) layer 35, and a p-InP layer 36 are sequentially formed on an n-InP substrate 31.

In detail, at first, n-InP is grown for a thickness of approximately 0.3 µm, n-InGaAsP is grown for a thickness of approximately 0.1 µm, and n-InP to be a cap layer is grown sequentially on a (100) plane of the n-InP substrate 31 by, for example, the MOVPE method. N-InGaAsP and n-InP are processed by the lithography and the etching. The lower cladding layer 32 of n-InP and the diffractive grating layer 33 of n-InGaAsP are thereby formed on the n-InP substrate 31.

Next, n-InP is regrown for a thickness of approximately 0.1 μm, an MQW active layer where a well layer made up of AlGaInAs and a barrier layer made up of AlGaInAs are multiply stacked is regrown for a thickness of approximately 0.2 μm, and p-InP is regrown for a thickness of approximately 0.1 μm sequentially on the diffractive grating layer 33 by the MOVPE method. The spacer layer 34, the MQW layer 35, and the p-InP layer 36 are thereby stacked to be formed on the diffractive grating layer 33. Here, the spacer layer 34 is formed such that a distance between the diffractive grating layer 33 and the active layer 35 becomes approximately 0.1 μm.

Figure 11B:
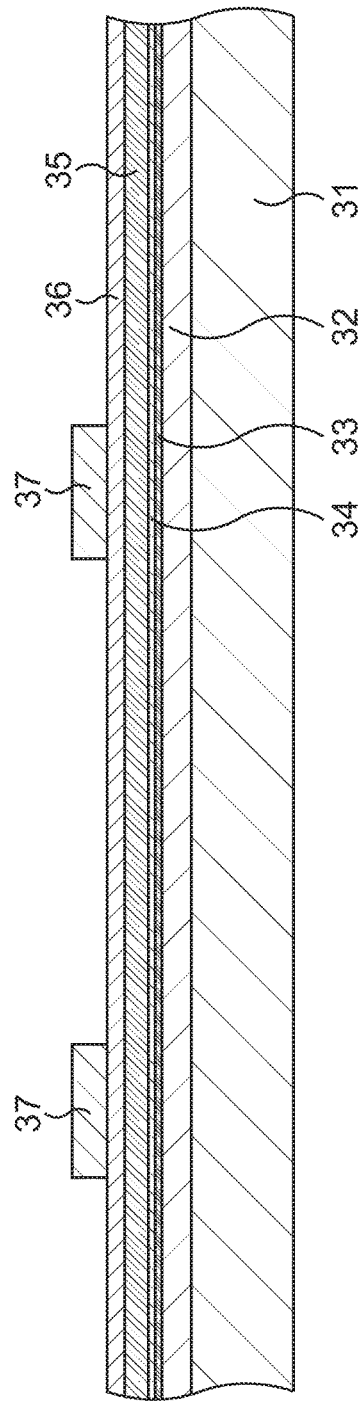
FIG. 11B is a schematic sectional view illustrating the manufacturing method of the distributed reflector laser in the ridge waveguide structure according to the second embodiment subsequent to FIG. 11A.

Subsequently, as illustrated in FIG. 11B, etching masks 37 are formed.

In detail, an insulating material, for example, $SiO_2$ is deposited by the CVD method or the like at a whole surface of the p-InP layer 36. This $SiO_2$ is processed by the lithography, and $SiO_2$ is remained only at portions where ridge parts are to be formed. The etching masks 37 are thereby formed on the p-InP layer 36.

Figure 11C:
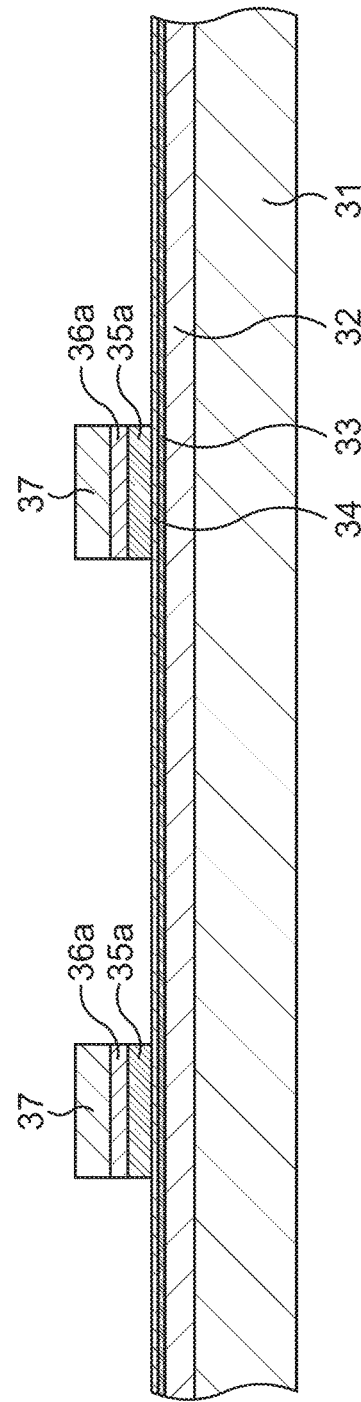
FIG. 11C is a schematic sectional view illustrating the manufacturing method of the distributed reflector laser in the ridge waveguide structure according to the second embodiment subsequent to FIG. 11B.

Subsequently, as illustrated in FIG. 11C, active layers 35a and first upper cladding layers 36a are formed.

In detail, the p-InP layer 36 and the MQW layer 35 are etched by using the etching masks 37. The MQW layer 35 and the p-InP layer 36 are thereby removed while remaining only portions under the etching masks 37, and the active layers 35a and the first upper cladding layers 36a are formed on the spacer layer 34.

Subsequently, as illustrated in FIG. 12A, semiconductor layers 38 which are connected to the active layers 35a and the first upper cladding layers 36a are formed on the spacer layer 34.

In detail, an impurity element, for example, InGaAsP where Fe is doped (Fe-doped InGaAsP) is regrown for a thickness of approximately 0.25 μm, Fe-doped InP is regrown for a thickness of approximately 0.05 μm sequentially by the MOVPE method or the like. The semiconductor layers 38 each made up by stacking an Fe-doped InGaAsP layer 38a and an Fe-doped InP layer 38b, and by being butt-joint connected to the active layer 35a and the first upper cladding layer 36a are thereby formed. Fe which forms a deep acceptor level is doped to the semiconductor layer 38 as the impurity, and therefore, it becomes a semi-insulating semiconductor which captures electrons to be high-resistant.

In the embodiment, Fe is cited as the impurity element which is doped to the semiconductor layer 38, and a structure using the semi-insulating semiconductor which captures electrons is exemplified, but it is also possible to obtain the similar effect by using a semi-insulating semiconductor where, for example, an impurity element which captures positive holes such as Ru, Ti is added.

Subsequently, as illustrated in FIG. 12B, the etching masks 37 are removed.

In detail, the etching masks 37 are removed by the wet treatment using a predetermined chemical liquid, for example, buffered hydrofluoric acid.

Figure 13:
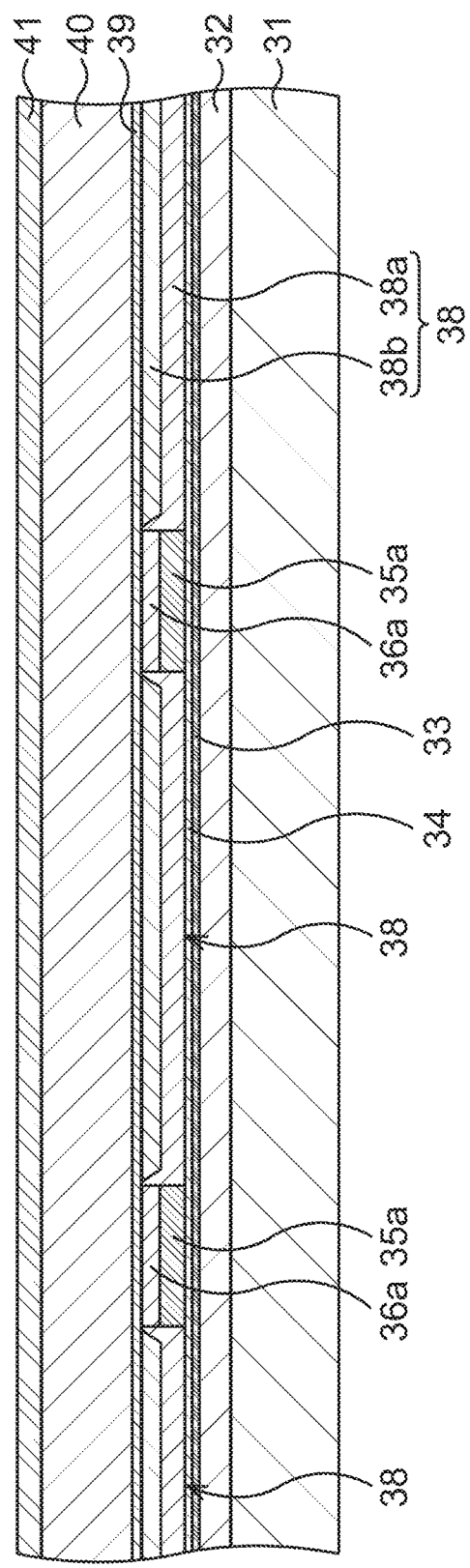
FIG. 13 is a schematic sectional view illustrating the manufacturing method of the distributed reflector laser in the ridge waveguide structure according to the second embodiment subsequent to FIG. 12B.

Subsequently, as illustrated in FIG. 13, an etch stop layer 39, a p-InP layer 40, and an InGaAs layer 41 are sequentially formed.

In detail, p-InGaAsP is grown for a thickness of approximately 0.02 μm, p-InP is grown for a thickness of approximately 1.5 μm, and InGaAs is grown for a thickness of approximately 0.3 μm sequentially at a whole surface on the first upper cladding layers 36a and the semiconductor layers 38 by the MOVPE method or the like. The etch stop layer 39, the p-InP layer 40, and the InGaAs layer 41 are thereby stacked to be formed.

Figure 14:
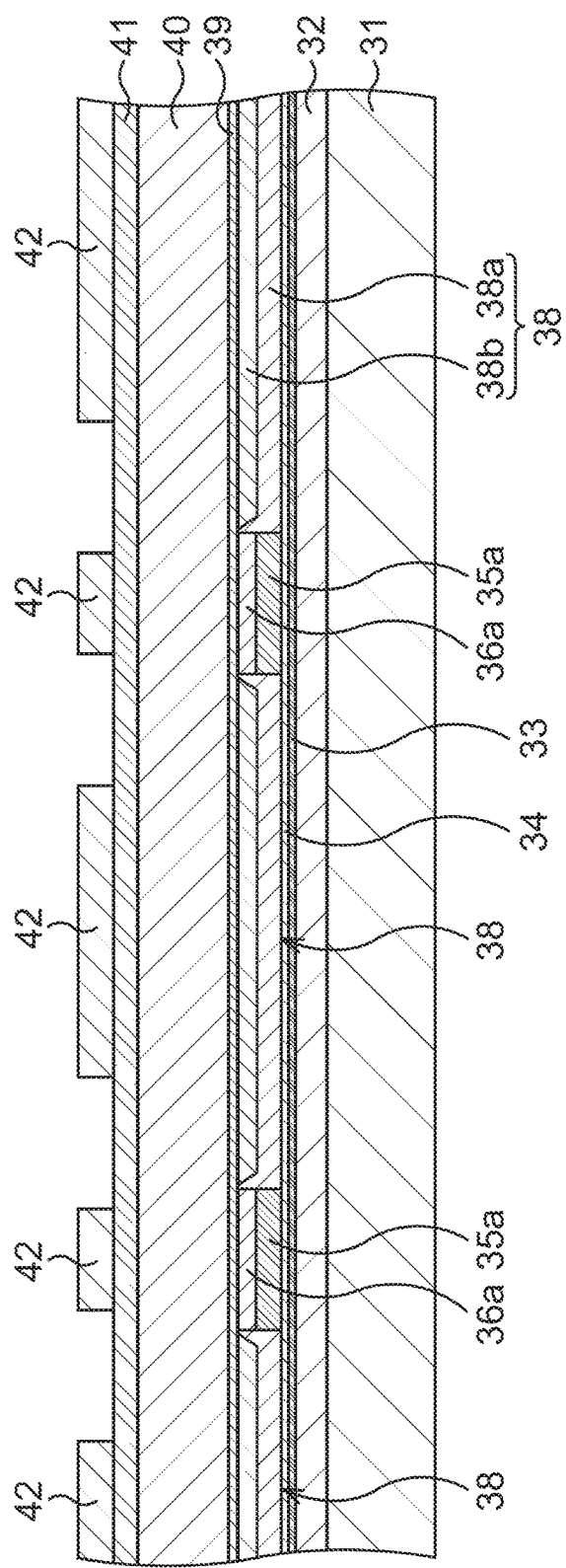
FIG. 14 is a schematic sectional view illustrating the manufacturing method of the distributed reflector laser in the ridge waveguide structure according to the second embodiment subsequent to FIG. 13.

Subsequently, as illustrated in FIG. 14, etching masks 42 are formed.

In detail, an insulating material, for example, $SiO_2$ is deposited by the CVD method or the like at a whole surface of the InGaAs layer 41. This $SiO_2$ is processed by the lithography, and $SiO_2$ is remained so as to expose formation portions of grooves to isolate by each laser (by each ridge part). The etching masks 42 are thereby formed on the InGaAs layer 41.

Figure 15:
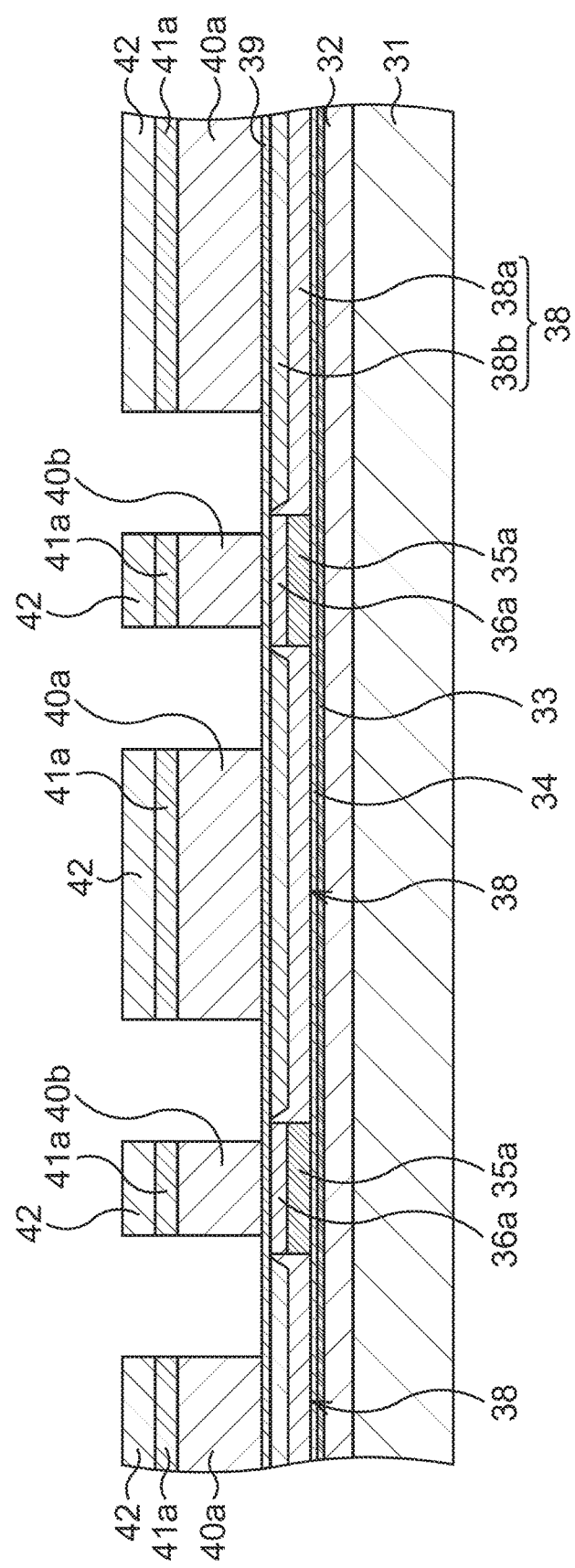
FIG. 15 is a schematic sectional view illustrating the manufacturing method of the distributed reflector laser in the ridge waveguide structure according to the second embodiment subsequent to FIG. 14.

Subsequently, as illustrated in FIG. 15, second upper cladding layers 40a, third upper cladding layers 40b and contact layers 41a are formed.

In detail, at first, the InGaAs layer 41 is etched by using the etching masks 42. Subsequently, the p-InP layer 40 is wet-etched by using etchant which selectively etches only InP. At this time, the etch stop layer 39 exists, and thereby, only the p-InP layer 40 is surely etched without making the etchant penetrate into the semiconductor layers 38 and the first upper cladding layers 36a. The second upper cladding layers 40a and the contact layers 41a are thereby formed on the etch stop layer 39. The third upper cladding layers 40b and the contact layers 41a are thereby formed on the etch stop layer 39. Each ridge part is made up of the third upper cladding layer 40b and the contact layer 41a. A ridge part width is, for example, approximately 2 μm. Here, the first upper cladding layers 36a are each locally aligned above the active layer 35a. The second upper cladding layers 40a are each locally aligned above the semiconductor layer 38. The third upper cladding layers 40b are each formed above the active layer 35a.

Subsequently, as illustrated in FIG. 16, the etch stop layer 39 is etched.

In detail, the etch stop layer 39 is wet-etched by using an etchant whose etching selectivity between InGaAsP and InP is large. At this time, in general, the etchant whose etching selectivity between InGaAsP and InP is large has a characteristic to etch InGaAs, and therefore, the contact layers 41a each made up of the InGaAs layer is etched for, for example, 0.05 μm. Grooves 43 are thereby formed, and each laser (each ridge part) is electrically isolated. An end part of a cross section which is perpendicular to an optical waveguide direction of the first upper cladding layer 36a positions below the grooves 43 which define the third upper cladding layers 40b.

Subsequently, as illustrated in FIG. 17, a protective film 44 and BCBs 45 which bury the grooves 43 are formed.

In detail, at first, an insulating film, for example, $SiO_2$ is deposited at a whole surface so as to cover internal surfaces of the grooves 43 by the CVD method or the like. The protective film 44 is thereby formed.

Next, the BCBs (benzocyclobutene) 45 are formed so as to bury in the grooves 43 via the protective film 44.

Subsequently, as illustrated in FIGS. 18 and 19, p-electrodes 46 and an n-electrode 47 are formed.

In detail, at first, the protective film 44 is processed by the lithography and the dry-etching to form openings 44a each exposing a part of a surface of the contact layer 41a.

Next, the p-electrodes 46 each buries the opening 44 and is electrically connected to the contact layer 41a are formed.

Next, a thickness is made thin to be, for example, approximately 150 μm by polishing a rear surface of the n-InP substrate 31. Then, the n-electrode 47 is formed on the rear surface of the n-InP substrate 31.

After that, the distributed reflector laser in the ridge waveguide structure according to the embodiment is formed by going through various processes such as a predetermined arraying, coating of an anti-reflective (AR) film for a front end face and a rear end face.

In the distributed reflector laser in the ridge waveguide structure according to the embodiment, both sides of the active layer 35a are sandwiched by butt-jointed regrown layers of the semi-insulating semiconductor layers 38 to have a strong current confinement structure. The Fe-doped InGaAsP layer 38a of the semiconductor layer 38 is formed in a composition with an emission wavelength of 1.2 µm (band gap energy of 1.03 eV) which is lattice-matched with InP, and a band gap of the Fe-doped InGaAsP layer 38a is larger than that of the active layer 35a which is formed in the composition with the emission wavelength of 1.3 µm (band gap energy of 0.95 eV). As stated above, the active layer 35a is sandwiched by the semiconductor layers 38 having the large band gap to be the strong current constriction structure, and therefore, the carrier is effectively injected into the active layer 35a.

Besides, the first upper cladding layers 36a and the third upper cladding layers 40b of the plurality of lasers (two lasers in the example of the drawing) are electrically insulated by the butt-jointed regrown layers, and therefore, it is possible to form a structure in which each laser is independently driven by a simple process.

Besides, the ridge parts being the DBR parts can be integrated by the same process, and therefore, it is possible to manufacture an integrated passive component without increasing the number of processes.

As described hereinabove, according to the embodiment, the DBR laser with high reliability in which the ridge waveguide structure whose manufacturing is relatively easy is applied, and the current diffusion and the electrical crosstalk between lasers in the ridge waveguide structure are suppressed is enabled.

In the first and second embodiments, it is described as for the structure in which AlGaInAs is used for the active layer, and InGaAsP is used for the butt-joint growth layer, but it is not limited to this constitution. For example, a mixed crystal semiconductor such as InGaAs, AlGaInAs, AlGaInP, InGaP, InGaAsSb may be used appropriately according to need.

In the first and second embodiments, it is described as for the structure in which the conductive type of the upper cladding layer which is formed on the n-type substrate is p-type, but it is not limited to this constitution. For example, the upper cladding layer may be formed on a p-type substrate or a high-resistance substrate, and the similar effect can be obtained if it is used for a structure in which the conductive type of the upper cladding layer is n-type.

In the first and second embodiments, it is described as for the laser device, but the similar effect can be obtained if it is used for an optical functional device or the like having an active layer which amplifies light. Besides, the similar effect can be obtained if it is used for a monolithic integrated optical semiconductor integrated device in which these are combined.

According to the present invention, an optical semiconductor device with high reliability in which a ridge waveguide structure whose manufacturing is relatively easy is applied, and current diffusion and electrical crosstalk between lasers in the ridge waveguide structure are suppressed is enabled.

According to the above-stated various modes, it is possible to enable an optical semiconductor device with high reliability in which a ridge waveguide structure whose manufacturing is relatively easy is applied, and current diffusion and an electrical crosstalk between lasers in the ridge waveguide structure are suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An optical semiconductor device, comprising:
   a semiconductor substrate;
   a lower cladding layer which is formed on the semiconductor substrate;
   an active layer formed on the lower cladding layer;
   a first upper cladding layer locally aligned above the active layer;
   a semiconductor layer formed on the lower cladding layer having a height which is not exceeded an upper surface of the first upper cladding layer and having a band gap which is larger than that of the active layer;
   a second upper cladding layer locally aligned above the semiconductor layer and having a refractive index smaller than the semiconductor layer; and
   a third upper cladding layer having a protruding shape locally aligned above the active layer,
   wherein the active layer and the semiconductor layer are contacted with the upper surface of the lower cladding layer and a side surface of the active layer and a side surface of the semiconductor layer are connected with each other, and
   wherein a thickness of the semiconductor layer is less than a value adding a thickness of the active layer and a thickness of the first upper cladding layer.

2. The optical semiconductor device according to claim 1, wherein at a cross section which is perpendicular to an optical waveguide direction, a connection part between the active layer and the semiconductor layer which are connected with each other positions below a groove which defines the third upper cladding layer.

3. The optical semiconductor device according to claim 2, wherein an etch stop layer is formed between the first upper cladding layer and the third upper cladding layer.

4. The optical semiconductor device according to claim 1, wherein the semiconductor layer is an i-type semiconductor or a semi-insulating semiconductor.

5. A manufacturing method of an optical semiconductor device, comprising:
   forming a lower cladding layer on a semiconductor substrate;
   forming an active layer on the lower cladding layer;
   forming a first upper cladding layer locally aligned above the active layer;
   forming a semiconductor layer formed on the lower cladding layer having a height which is not exceeded an upper surface of the first upper cladding layer and having a band gap which is larger than that of the active layer;

forming a second upper cladding layer locally aligned above the semiconductor layer and having a refractive index smaller than the semiconductor layer; and forming a third upper cladding layer having a protruding shape which is locally aligned above the active layer, wherein the active layer and the semiconductor layer are contacted with the upper surface of the lower cladding layer and a side surface of the active layer and a side surface of the semiconductor layer are connected with each other, and wherein a thickness of the semiconductor layer is less than a value adding a thickness of the active layer and a thickness of the first upper cladding layer.

6. The manufacturing method of the optical semiconductor device according to claim 5, wherein the forming the upper cladding layer includes:

forming a first upper cladding layer locally aligned above the active layer, a second upper cladding layer locally aligned above the semiconductor layer and a third upper cladding layer formed above the active layer to confine light which is guided in the active layer, wherein at a cross section which is perpendicular to an optical waveguide direction, a connection part between the active layer and the semiconductor layer which are connected with each other positions below a groove which defines the third upper cladding layer.

7. The manufacturing method of the optical semiconductor device according to claim 6, wherein an etch stop layer is formed between the first upper cladding layer and the third upper cladding layer, and the third upper cladding layer is formed to be only above the first upper cladding layer by using the etch stop layer.

8. The manufacturing method of the optical semiconductor device according to claim 5, wherein the semiconductor layer is an i-type semiconductor or a semi-insulating semiconductor.

* * * * *